(12) United States Patent
Frith

(10) Patent No.: US 6,600,365 B1
(45) Date of Patent: Jul. 29, 2003

(54) AUDIO TRANSIENT SUPPRESSION CIRCUITS AND METHODS

(75) Inventor: Peter J. Frith, Edinburgh (GB)

(73) Assignee: Wolfson Microelectronics Limited, Edinburgh (GB)

( * ) Notice: Subject to any disclaimer, the term of this patent is extended or adjusted under 35 U.S.C. 154(b) by 0 days.

(21) Appl. No.: 10/146,114

(22) Filed: May 16, 2002

(30) Foreign Application Priority Data

May 10, 2002 (GB) .............................................. 0210770

(51) Int. Cl.[7] ................................................. H03F 1/14
(52) U.S. Cl. ......................................... 330/51; 330/149
(58) Field of Search .......................... 330/51, 75, 149; 381/94.5

(56) References Cited

U.S. PATENT DOCUMENTS

| | | |
|---|---|---|
| 4,054,845 A | 10/1977 | Glogolja et al. |
| 4,366,442 A | 12/1982 | Yamada |
| 4,410,855 A | 10/1983 | Underhill et al. |
| 5,515,431 A | 5/1996 | Kühnle et al. |
| 5,805,020 A | 9/1998 | Danz et al. |
| 6,208,203 B1 * | 3/2001 | Jung et al. ..................... 330/51 |
| 6,326,844 B1 * | 12/2001 | Morris, Jr. et al. ......... 330/149 |
| 6,346,854 B1 | 2/2002 | Heithoff |

FOREIGN PATENT DOCUMENTS

| | | |
|---|---|---|
| EP | 1229639 A2 | 8/2002 |
| GB | 2308251 A | 6/1997 |
| KR | 9403349 | 4/1994 |
| WO | WO-98/45938 | 10/1998 |

* cited by examiner

*Primary Examiner*—Henry Choe
(74) *Attorney, Agent, or Firm*—Dickstein Shapiro Morin & Oshinsky, LLP

(57) ABSTRACT

Audio transient suppression circuit (300) has two modes, a first, for example active mode in which the circuit operates to provide an audio signal output and a second, for example standby mode in which said audio signal output is suppressed. The circuit comprises at least one active signal processing stage having an output node (128), the output node having a dc signal path to a first dc voltage (104), said dc signal path including at least one first resistive element (122, 124). The circuit further comprises an output signal transient suppresser, said transient suppresser comprising a second resistive element (304) switchably connected (302) between a second dc voltage (102) and said output node. The second resistive element has a resistance selected such that when said second resistive element is connected the voltage on said output node in said second mode is substantially equal to a quiescent voltage on said output node in said first mode.

24 Claims, 4 Drawing Sheets

AUDIO TRANSIENT SUPPRESSION CIRCUITS AND METHODS

FIELD OF THE INVENTION

This invention is generally concerned with audio transient suppression circuits and methods and is particularly applicable to the suppression of an audio transient when an amplifier is switched between an active and a standby mode.

BACKGROUND TO THE INVENTION

When a piece of audio equipment, such as a power amplifier, is switched on a transient signal often appears at the output. This can cause switch-on "thump", which projects an unsophisticated impression and, in a power amplifier, can damage loudspeakers. A conventional way of reducing such a power-on thump is to temporarily disconnect the amplifier output during switch-on, for example using a relay. However this basic solution is often unsatisfactory, for example where the output load is ground referenced and ac coupled. Moreover it is commonplace in modern audio equipment design for amplifiers and the like to be switched in and out of a standby condition in which internal components are only partially powered, and improved techniques are needed for such designs.

Current audio systems tend to be constructed using integrated silicon technology rather than discrete components. Typically a single-supply, as opposed to a split-supply, is used to reduce power supply cost and to reduce the supply voltage range. This facilitates use of the latest silicon technology in audio integrated circuits of an audio system. In this context single-supply refers to a power supply with a single output (and another, say ground, connection) rather than to a power supply with, for example, positive and negative supply voltages (referenced to ground). In a single-supply arrangement a load is typically ground-referenced whereas an audio signal will typically deviate from a quiescent value midway between ground and the single supply and thus, to avoid a quiescent dc output from the audio system ac coupling (i.e. a capacitor) is generally employed. However, as will be seen in more detail below, this introduces difficulties associated with charging and discharging of the ac coupling capacitor.

The above-described systems are often intelligent enough to have multiple modes, and typically a standby mode is provided for power management. A general problem with such systems, however, is the presence of audible clicks when switching between modes, caused by transient signals on the audio output. Although these clicks may only have a relatively low volume they are nevertheless aesthetically undesirable and distracting to a user. Likewise audio systems usually have at least two channels, to provide a stereo output, and often have several channels. In such systems it is not uncommon for crosstalk to result in switching in one channel causing clicking in another.

It is therefore desirable to be able to minimise audio output transients, particularly when switching between standby and active modes of an audio system such as an audio amplifier. It is further desirable to reduce the risk of crosstalk between different channels of a multiple-channel system.

WO 98/45938 describes an audio transient suppression device in which an FET switch with a variable resistance is used to couple a biassing voltage equal to a "common mode voltage" to an output node. However a difficulty with this arrangement is the need for a common mode bias voltage source with a relatively low output impedance, as will be described in more detail below.

U.S. Pat. No. 5,515,431 (EP 0 642 247 A) describes a speakerphone for a telephone circuit which employs control circuitry monitoring an output node to detect when charging of an ac coupling capacitor is "complete". However the additional control circuitry described in this document is relatively complex and its implementation would be expensive. Background prior art can be found in U.S. Pat. Nos. 5,805,020, 6,346,854, 4,410,855, 4,054,845 and KR 9,403, 349.

Consider now the circuit of FIG. 1, which shows a digital audio system 100 with active and standby modes. Two switches S1 126 and S2 134 are provided for switching between the active and standby modes. During normal operation ("active" mode) S1 126 is closed and S2 134 is open; in standby mode S1 126 is open and S2 134 is closed.

The audio system 100 has two supplies, Vdd 102, a "positive" supply, and Vss 104, a "negative" supply, in a practical implementation these typically being provided from a single-ended supply comprising, for example, a positive voltage and ground. A potential divider is formed by resistors R4 106 and R5 108 which are coupled between Vdd 102 and Vss 104 to provide, at node 112, a voltage which, where R4 is equal to R5, is a mid-rail voltage Vmid=(Vdd+Vss)/2. Voltage Vmid 112 is decoupled by capacitor C2 110 to remove Vdd supply ripple and noise.

Voltages Vmid 112 and Vss 104 provide voltage references to a digital-to-analogue converter (DAC) 114, which has a digital input 116 and which provides an analogue output Vdac 118. The analogue output is adjustable under control of digital input 116 between Vmid 112 and Vss 104 and, with a digital audio signal, the output swings between maxima of Vmid and Vss and has a quiescent voltage halfway between these two voltages. It will be appreciated that for an audio signal the quiescent voltage with respect to Vss is determined by the reference (or supply) voltages to DAC 114.

In active mode, switch S1 126 is closed and operational amplifier A1 120 is then configured as a non-inverting amplifier (in this example) with resistors R1 122 and R2 124 providing feedback from output node X 128. It will be noted in the circuit of FIG. 1 that the feedback around operational amplifier 120 is referenced to Vss 104 rather than to Vmid 112 and thus the quiescent dc level output from DAC 114 with respect to Vss 104 is multiplied by (1+R1/R2), as well as the audio signal. In the case of equal-valued R1 and R2 the non-inverting amplifier has a gain of two. When input voltage Vdac at 118 is equal to Vss, output voltage at X 128 is also Vss. When input voltage Vdac at 118 is equal to Vmid, output voltage at X 128 is Vss+2*(Vmid−Vss)=Vdd. When input voltage Vdac at 118 is at the quiescent value (Vss+Vmid)/2, output voltage at X 128 is Vss+2*({Vmid+Vss}/2−Vss)=Vmid. Thus the output signal at X 128 swings between Vss and Vdd, with a quiescent voltage of Vmid.

Where all or part of the audio system 100 is fabricated on an integrated circuit, R1 and R2, and R4 and R5, may be closely spaced and physically similar to provide closely matching component values. In this way the quiescent and standby voltages at output node 128 can be controlled to be close to Vmid despite any manufacturing tolerances in the absolute value of resistors R1, R2, R4 and R5.

The signal at output node X 128 is ac coupled by a capacitor C1 130 to drive the ac output signal into an external load R3 132. Load 132 has its non-driven end connected to an external ground 106, typically at Vss potential.

In the above-described audio DAC system 100 as previously mentioned, typically Vss is ground and Vdd is provided from a single positive supply. The circuit then provides a maximum audio output swing of ground to the supply voltage from a well-decoupled reference Vmid. It will be appreciated for the purposes of the following discussion of the manner in which audio clicks arise and may be suppressed, that the principles may be applied to any audio system and are not restricted to the particular illustrated example in which an audio signal happens to be generated by a digital-to-analogue converter.

As shown in FIG. 1 the audio system has a standby mode in which much of the system may be powered down, for example during temporary absence of a signal. Moreover an audio system employing a DAC subsystem as shown in FIG. 1 may often have multiple channels, not all of which need to be active all of the time. Switches S1 126 and S2 134 implement such a "standby" mode. Here "standby" mode is used in a general sense to denote a mode in which an audio output signal is suppressed, although generally the purpose of such a suppression is to allow at least a portion of an audio circuit to be powered down.

In the arrangement of FIG. 1, when the circuit is in standby mode switch S1 126 is open and thus the power to operational amplifier 120, and optionally to DAC 114, may be removed. However on entry into the standby mode resistors R1 122 and R2 124 will tend to pull output node 128 down to Vss 104 and this negative voltage jump will give rise to a corresponding audible "click" or "thump" in the audio signal at node Y 131. Moreover, when operational amplifier 120 is reactivated and switch S1 126 is closed to revert to "active" mode, there will be a "thump" of the opposite polarity as the voltage at node X 128 jumps back up to the quiescent voltage value, hence causing a transient increase at node Y 131.

Switch S2 134 and dashed connection 136 between Vmid 112 and output node X 128 represents one attempt to address this problem. Providing that the parallel impedance of R4 106 and R5 108 is much less than the series impedance of R1 122 plus R2 124, closing switch S2 134 can reduce the size of these transients. The low impedance combination of R4 and R5 provides a relatively stiff voltage drive at Vmid to node X 128, which is little affected by resistors R1 122 and R2 124 and thus because node X 128 is maintained close to Vmid in standby mode, the audio transient when switching into or out of standby mode is reduced. In practice a suitably low impedance combination of R4 106 and R5 108 is likely to draw too much current from Vdd 102. Furthermore, for adequate decoupling of Vmid at audio frequencies a low impedance implies a large value for capacitor C2 110, which is bulky and uneconomic. So a buffer may be employed between Vmid 112 and path 136. Such a buffer would, however, need to be powered in standby mode which would at least partially defeat the object of implementing a standby mode in the first place. Moreover the additional cost and complexity of such an arrangement is undesirable.

The arrangement of FIG. 2 shows an improvement to the circuit of FIG. 1 in which an additional switch S3 138 is inserted between R2 124 and Vss 104. Switch S3 138 is normally closed (in "active" mode) but is opened in standby mode. The effect of S3 138 in standby mode is to disconnect resistors R1 122 and R2 124 from Vss 104 so that in standby mode they do not try to pull output node 128 down to Vss 104. Thus node 128 can be biased to Vmid 112 by resistors R4 106 and R5 108 in standby mode to provide an output voltage at node X 128 nominally equal to Vmid in both modes.

There are, however, problems associated with such a solution. In an integrated implementation of the arrangement of FIG. 2 switch S3 138 will typically comprise either a MOS or a bipolar transistor. This transistor will have a non-zero on resistance, in series with R2 124, which will change the signal gain, and more significantly alter the quiescent voltage on node X 128. This may be compensated by adjusting the value of R1 and/or R2, but these resistors will have no correlation with the manufacturing tolerances or variation over temperature of the transistor on-resistance, so that there will still be some variation of the voltage at output node 128. If switch S3 138 comprises a bipolar transistor, there will also be an additional offset due to its saturation voltage.

The on-resistance of switch S3 138 will also typically vary with signal current. This will be a small effect, but can still be significant for the >100 dB linearity specifications of modern audio signals. Wherever possible, an audio designer will try to keep transistor switches out of any audio signal path (switch S1 126 is tolerable only because it is inside the feedback loop around the op amp, so its non-linearities will be suppressed).

Furthermore, typically load R3 132 will be an external load such as headphones, a loudspeaker, a power-amplifier input, or the like. In a multi-channel system this load may intially not be connected, but may be connected at a time when a subsystem such as the illustrated circuit is inactive, but whilst the remainder of the multi-channel system is still active. On reconnection of the load, any transients in the charging of C1 130 can then give rise to transients on output node X 128 that may not be completely attenuated by decoupling capacitor C2 110. This can result in crosstalk and clicks on the active channels. For example Vmid 112 may be used to bias other inputs such as microphone inputs, with high signal gain, so even that small transients on Vmid 112 may give undesirable and audible clicks on these other inputs.

An improved audio transient suppression system is therefore desirable.

SUMMARY OF THE INVENTION

According to a first aspect of the present invention there is therefore provided an audio signal processing circuit with two modes, a first mode in which the circuit operates to provide an audio signal output and a second mode in which said audio signal output is suppressed, the circuit comprising at least one active signal processing stage having an output node, the output node having a dc signal path to a first dc voltage, said dc signal path including at least one first resistive element, the circuit further comprising an output signal transient suppresser said transient suppresser comprising a second resistive element switchably connected between a second dc voltage and said output node, said second resistive element having a resistance selected such that when said second resistive element is connected the voltage on said output node in said second mode is substantially equal to a quiescent voltage on said output node in said first mode.

The first and second dc voltages preferably comprise fixed or reference voltages such as supply voltages, for example Vdd and ground. In this way the second resistive element provides a switched resistive path from the output node to, for example, a supply voltage, thereby making use of an existing voltage source so that there is no need for an additional, for example buffered, voltage source. Broadly speaking the second resistive element forms, together with the first resistive element comprising part of the active signal processing stage, a potential divider which, when the second resistive element is connected, maintains the voltage on the output node to substantially a quiescent voltage, for example a voltage present when there is no audio signal.

The arrangement is simple and cheap to implement and does not require switching elements within the feedback paths of the amplifier although the first resistive element may comprise, for example, a feedback element such as one or more amplifier feedback resistors. Preferably the audio signal processing circuit is at least partially implemented on an integrated circuit to facilitate good matching of the values of the first and second resistive elements which, in embodiments, have substantially. the same value. A switch for switching the second resistive element may comprise, for example, an MOS or bipolar transistor or a transmission gate such as a MOSFET-based CMOS switch.

The audio signal processing circuit may be any audio signal processing circuit but preferably comprises an amplifier or pre-amplifier. The arrangement is particularly suitable for single-supply circuit implementations, particularly single-supply integrated circuits, and is particularly suitable for multi-channel audio systems implemented using such integrated circuits.

In embodiments the active signal processing stage comprises an operational amplifier or buffer and the first resistive element comprises one or more feedback resistors for setting an operating point or parameter of the circuit. The active signal processing stage preferably includes a drive device which is effectively disconnected from the output node in the second mode (standby mode), for example either by means of a switch or by placing the drive device into a high impedance state.

The active signal processing stage may be an intermediate stage of a circuit or an output stage, for example connected to an output coupling capacitor to provide an ac coupled circuit output. However where the output of this first stage is dc coupled the voltage on this output node may be chosen to provide a suitable quiescent voltage for an output of a subsequent stage, in particular where there is a dc signal path from the output of the first stage to an output of a subsequent stage. Alternatively setting a quiescent voltage at the output node may be accomplished by making use of a dc signal path to a fixed voltage, preferably a supply voltage, more preferably ground, of a preceding stage. In this case the drive output of the preceding stage is preferably effectively disconnected in standby mode. In other words, where there is a chain or other network of several dc coupled stages the second resistive element may be connected to any (final or intermediate) output in the chain to define dc conditions at the final (and intermediate) outputs when (preferably all) the drive outputs are effectively disconnected.

In a multichannel system preferably the first and second dc reference voltages are common to all the channels.

In another aspect the invention also provides a method of suppressing audio output transient in an audio signal processing circuit having an active mode and a standby mode, the method comprising biasing an output node of the circuit in standby mode to substantially a quiescent level of the output in active mode, said biasing being accomplished by means of a resistive divider, at least one portion of the divider being formed by one or more first resistors coupled to said output node when said audio signal processing circuit is operating in said active mode.

Preferably the biasing comprises coupling a second portion of the resistive divider to the output node and decoupling a drive signal from the output node when switching from active mode to standby mode and vice-versa. The second portion of the resistive divider preferably comprises one or more second resistors substantially matched to the one or more first resistors, for example by providing the resistors on a common substrate.

In a further aspect there is provided a method of suppressing audio output transient in an audio signal processing circuit having an active mode and a standby mode, the method comprising connecting one or more bias resistors between a supply voltage for said circuit and an output node of the circuit when in standby mode, whereby said output node of the circuit is biased, in standby mode, to substantially a quiescent level of the output in active mode.

The invention also provides circuits operating in accordance with the above-described methods.

Broadly speaking in embodiments an amplifier or buffer output (or the output of a filter or other signal processing circuit) is in effect disconnected in standby mode. An output node which would otherwise be pulled towards a supply rail (for example pulled low) by one or more impedance elements within the circuit, is pulled back towards a quiescent or no-signal voltage by elements matched to those elements pulling the output node towards the supply rail. The impedance elements pulling the output towards a supply rail typically comprise feedback circuit elements, often one or more resistors and the matching element or elements preferably therefore comprises a matched resistance. The skilled person will understand that "matched" in this context does not necessarily imply "equal" but could imply, for example, the use of matched resistors to provide an accurate resistor ratio.

Broadly speaking one or more switched resistors are employed to form a potential divider, at least part of the divider comprising one or more resistors (or resistance elements) performing a role in the circuit when the circuit is operating in its active mode, such as setting an operating point, or parameter, or characteristic of the circuit. This provides an accurate and cheap method of setting a quiescent output voltage in standby mode. Preferably the resistor matching and amplifier offset are good enough to give a low voltage step when switching between normal and standby modes, for example less than 30 mV, and preferably less than 10 mV.

In embodiments the amplifier or buffer has two active stages and the output of one stage, for example a later stage in the signal path is pulled towards a supply rail by means of a dc signal path through feedback elements of both stages. In this case the output node of either stage may be pulled back towards a quiescent voltage. For example the output of the second stage (in the signal path) may be pulled towards a quiescent voltage as described above or the output of the first stage may be pulled back towards a voltage, in particular a quiescent voltage, so as to cause the output of the second stage to be pulled back towards a quiescent voltage. Preferably in standby mode active outputs of both stages are disconnected from the feedback arrangements used to set the output voltage of one or both stages at a quiescent level.

An amplifier system according to a yet further aspect of the invention may have two or more states, including an active state and a standby state. An output node of the system is connected resistively to a voltage different from its quiescent "active" voltage and, in active mode, this node is driven to a "correct" quiescent voltage by an amplifier. In standby mode this amplifier is substantially disconnected or disabled and the aforementioned resistive connection to the output node tends to drag the output node to the (different) voltage to which it is connected. This tendency is counteracted by a resistor connected, via a switch, to a voltage source. The value of the resistor is selected to substantially reinstate a quiescent voltage on the output node in standby mode.

Often, but not necessarily, the output node is ac coupled to a load via a capacitor. Output thump is controlled or muted by providing substantially the same quiescent dc voltage on the active side of the capacitor, thereby suppressing or removing switching transients. Preferably switch-on thump is controlled by different means well known to those working in the field, such as restricting the drive of the operational amp on powerup or slowing down the initial rate of change of voltage with time, dV/dt, of Vmid.

The switch to connect the resistor to reinstate the quiescent voltage on the output node may comprise an MOS transistor or transmission gate or bipolar transistor. The amplifier may be disconnected by means of a similar switch in series with its output, or its output stage may be turned off to provide substantially zero output current (i.e. it may be placed into a high impedance. Either (or neither) of a Vss and Vdd connection may be at an external ground potential; the quiescent voltage may be Vdd/2 or some other voltage.

The switched resistor may be at either the output or the fixed voltage side of the switch, or the switch may be provided at a connection between a pair of resistors together having a value to reinstate the quiescent voltage on the output node. Where a switch is provided between a pair of resistors a capacitor may be provided at the switched end of the top (reference or supply-connected) resistor to ac ground to filter out ac supply noise.

The amplifier system may have multiple channels, preferably each with its own switched resistor to reinstate the quiescent voltage on an output node of a respective channel. In such an arrangement multiple channels may be switched independently but may share such a decoupling capacitor and the top (reference or supply-connected) resistor.

BRIEF DESCRIPTION OF THE DRAWINGS

These and other aspects of the present invention will now be further described, by way of example only, with reference to the accompanying figures in which.

DETAILED DESCRIPTION OF THE PREFERRED EMBODIMENTS

Figure 1:
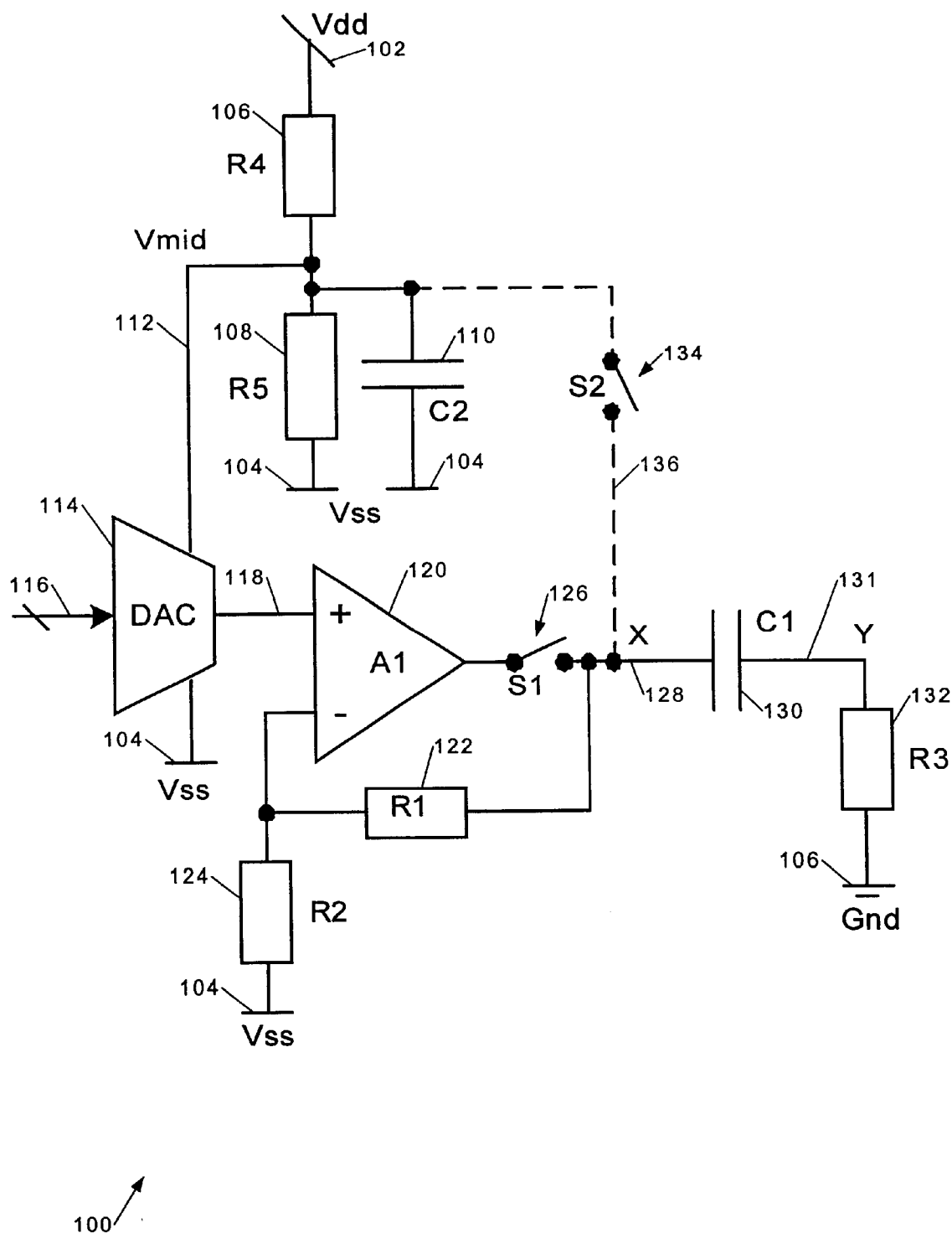
FIG. 1 shows a circuit diagram of a first audio system incorporating an anti-thump circuit.
Figure 2:
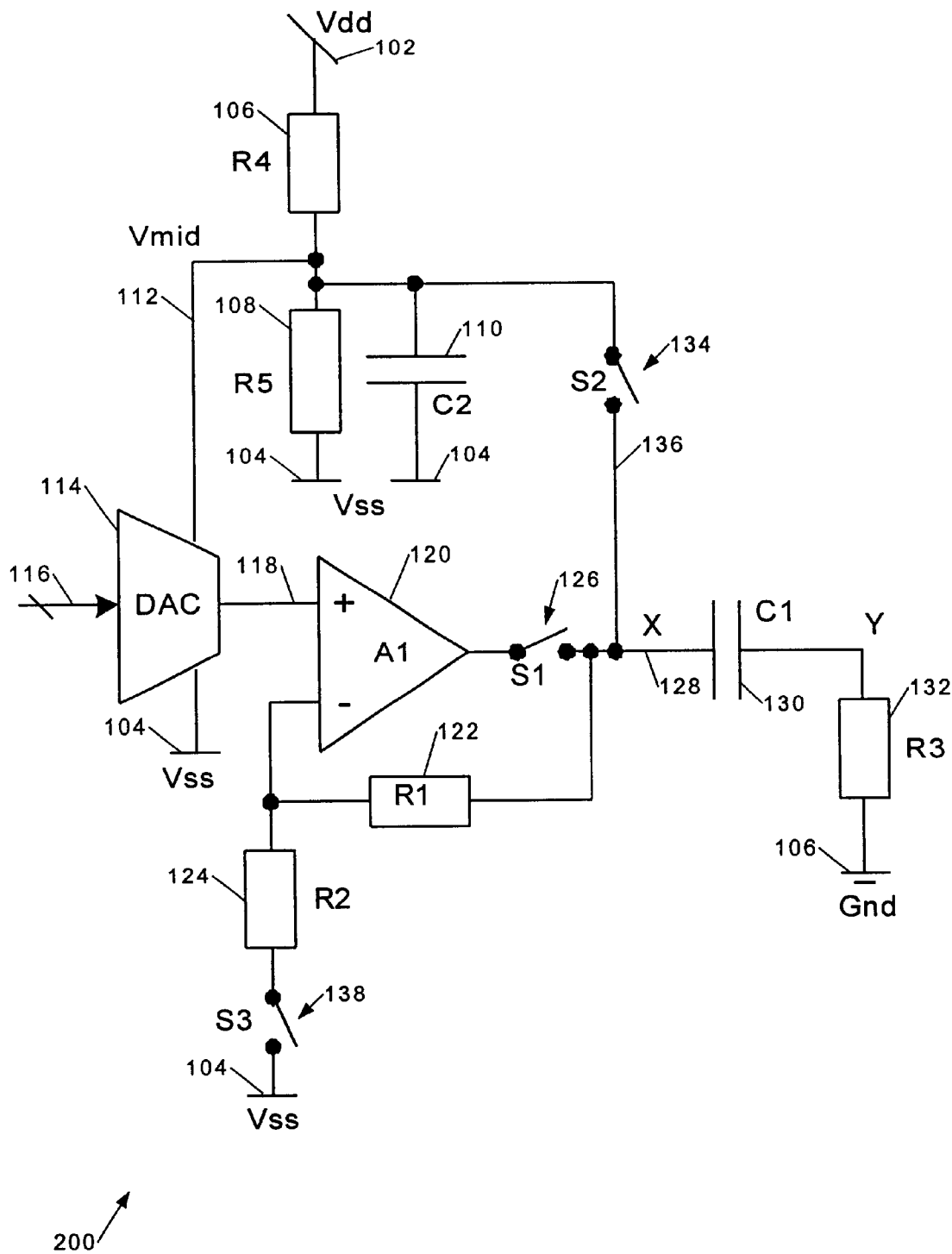
FIG. 2 shows a circuit diagram of a second audio system incorporating a second anti-thump circuit.
Figure 3:
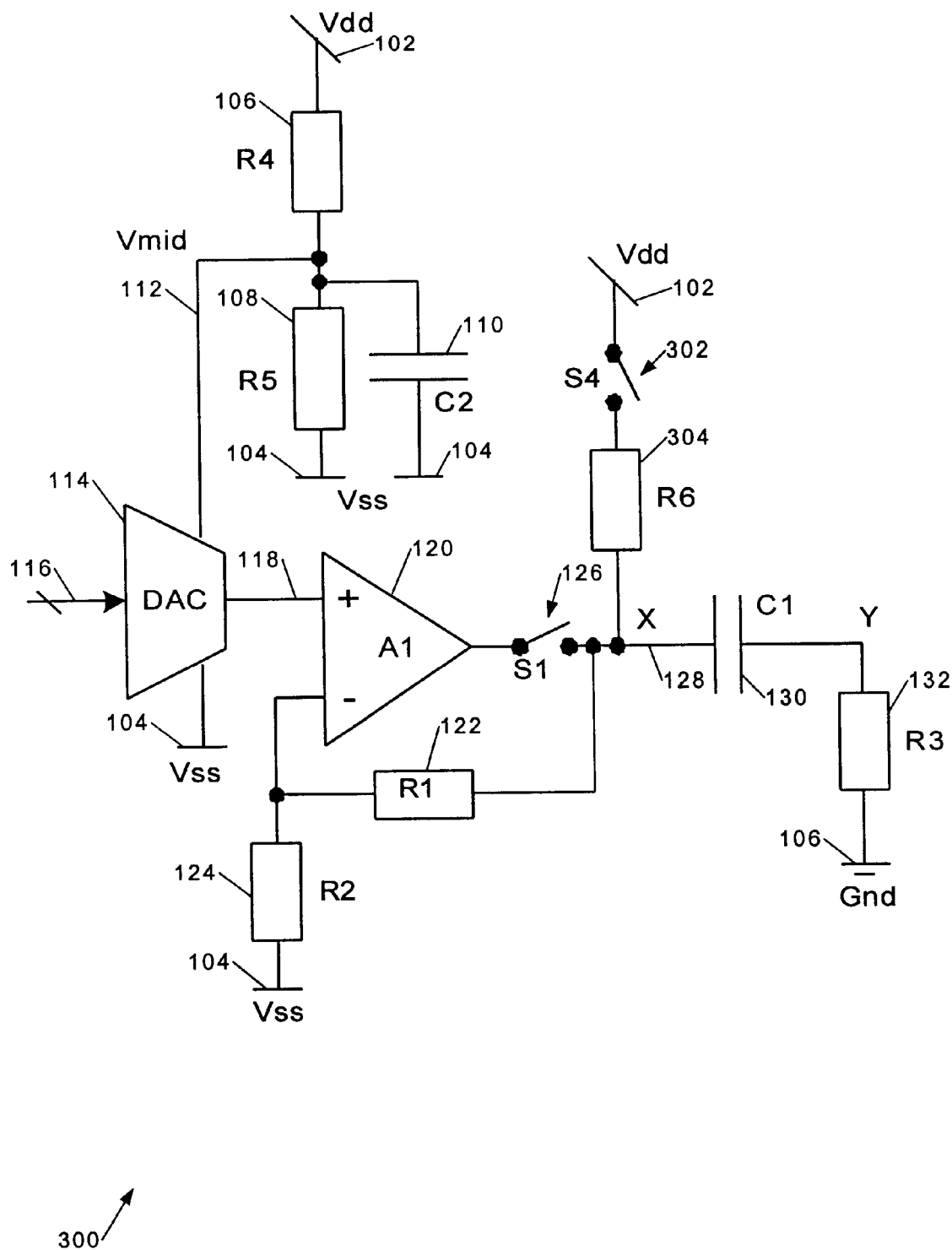
FIG. 3 shows a circuit diagram of an audio system embodying an aspect of the present invention and including an audio transient suppression circuit.

Referring now to FIG. 3, this shows an audio system 300 similar to that of FIG. 1 but incorporating an audio transient suppression circuit according to an embodiment of the present invention. In particular, a resistor R6 304 is connected in series with a switch S4 302 between Vdd 102 and output node X 128.

When the system is in active mode switch S4 302 is open and switch S1 126 is closed. When the system is in standby mode switch S1 126 is open to disconnect the output of operational amplifier 120 and switch S4 302 is closed to connect output node 128 to Vdd 102 via resistor R6 304. The value of R6 304 is selected (if necessary taking into account the resistance of switch S4 302) such that in standby mode the voltage at node X 128 is substantially equal to Vmid (i.e. the quiescent voltage) when R6 304 is connected in series with R1 122 and R2 124 between Vdd 102 and Vss 104. Where the quiescent voltage is equal to the Vmid, R6 304 is substantially equal to the series resistance R1 122 and R2 124.

The arrangement of FIG. 3 provides a number of advantages.

Resistors R1 122, R2 124 and R6 304 can be designed to be well-matched in an integrated circuit-based system, so that Vmid is close to its nominal value, thus minimising any transient on node X 128 when the system is switched from active to standby mode. There is no need for any transistor switches to be connected in series with R1 122 and R2 124 in active mode, thus avoiding offset or distortion which might otherwise be introduced by these. Furthermore in a multi-channel system, since switch S4 302 connects resistor R6 304 to a low impedance, well-decoupled supply (Vdd 102), there is less risk of transients coupling into other channels.

Figure 4:
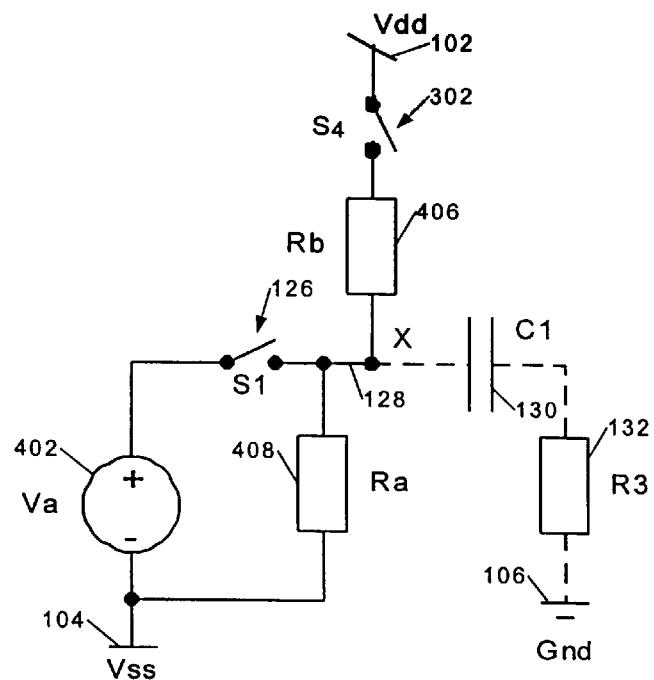
FIG. 4 shows a schematic diagram illustrating a concept embodying an aspect of the present invention.

FIG. 4 shows a schematic diagram illustrating a concept underlying the audio transient suppression arrangement of FIG. 3.

In FIG. 4 amplifier 120 is represented as a Thevenin voltage source 402 providing a voltage output Va. Other elements in the schematic diagram of FIG. 4 like to those of FIG. 3 are given like reference numerals. Thus voltage source 402 drives output node 128 via switch S1 126 which is normally closed when the circuit is active and which is open when the circuit is in standby mode. The pair of feedback resistors R1 122 and R2 124 in the circuit of FIG. 3 are represented by resistor Ra 408 and resistor R6 304 is represented by resistor Rb 406, which is coupled to Vdd 102 via switch S4 404 (normally open in active mode). As before, output node X 128 is coupled to load R3 132 via ac coupling capacitor 130. In the example shown Ra=R1+R2 but the skilled person will understand that Ra may represent different combinations of resistive elements in other signal processing circuits.

In general Va is given by:

$$Va=Vss+(Vdd-Vss)*y \qquad \text{(Equation 1)}$$

where y is some fixed value between 0 and 1, typically 0.5 as in the presently described example.

Since S1 126 is inside a feedback loop, its resistance may be ignored. In standby mode switch S1 126 is opened and switch S4 302 is closed. Resistance Rb 406 represents R6 304, preferably in series with any parasitic resistance of switch S4 302. Thus in standby mode the voltage Vx of output node X 128 is given by:

$$Vx=Vss+(Vdd-Vss)/(1+Rb/Ra) \qquad \text{(Equation 2)}$$

For node X 128 to be at substantially the same voltage in both active and standby modes the requirement is that:

$$Vss+(Vdd-Vss)*y=Vss+(Vdd-Vss)/(1+Rb/Ra) \qquad \text{(Equation 3)}$$

And thus $$Rb/Ra=(1/y)-1 \qquad \text{(Equation 4)}$$

If y=0.5, thus implies that a requirement that Rb=Ra.

Figure 5:
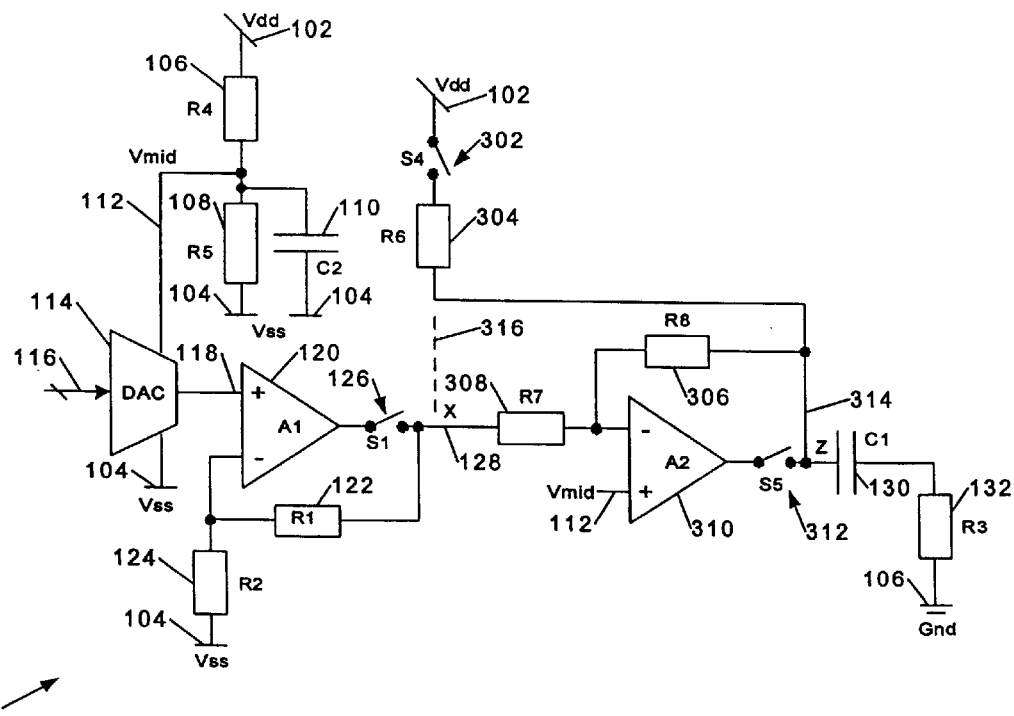
FIG. 5 shows a two-stage audio system embodying an aspect of the present invention and including an audio transient suppression arrangement.

FIG. 5 shows an extension of the audio transient suppression arrangement to a two-stage amplifier circuit 500. The arrangement of FIG. 5 is similar to that of FIG. 3 except that an additional, inverting amplifier stage has been added between output node 128 and output coupling capacitor 130. This additional stage comprises an operational amplifier 310 with a non-inverting input connected to Vmid 122 and feedback resistors R8 306 and R7 308 setting the gain. As with operational amplifier 120, a switch S5 312 is provided to decouple the output of amplifier 310 from an output node Z 314 connected to coupling capacitor 130. Switch S5 312 is closed in "active" and open in standby mode.

As drawn in FIG. 5, output node Z 314 is pulled down towards Vss 104 by means of a resistive path including resistors R8 306, R7 308, R1 122, and R2 124 when system 500 is in standby mode. Switched resistor R6 304 is connected to node Z 314 and, in the terminology of FIG. 4, Ra=R8+R7+R1+R2. For output node Z 314 to be set at Vmid in standby mode thus requires that the resistance of R6 304 together with parasitic resistance of switch S4 302 is equal to the combined resistance of R8 306, R7 308, R1 122, and R2 124.

In an alternative arrangement resistor R6 304 may be coupled to node X 128 rather than to node Z 314, as indicated by dashed line 316. In this case Ra=R1+R2 and to set node X 128 at Vmid the combination of R6 304 and any on-resistance of switch 302 is selected to be substantially equal to the series combination of R1 122 and R2 124. It will be recognised that with this arrangement when switch S5 312 is open the voltage at node Z 314 will be pulled towards the quiescent voltage at node X 128 via resistors R8 306 and R7 308 and, in time, will settle to the substantially the same voltage as that at node X 128.

The skilled person will understand that in the above-described embodiments switch S1 126 (and where applicable S5 312) may not be physically present as shown. Instead an output drive stage, for example of an operational amplifier, may instead be effectively disconnected by switching it into a high impedance output state, that is a state in which it provides substantially zero output current drive.

The circuits and methods described herein are not limited to systems where there is an ac coupling capacitor in the signal path, and the avoidance of transients on switching between standby and active modes can be equally important for fully dc coupled systems. The skilled person will appreciate that the described circuits and methods are also applicable to such dc coupled systems, such as systems in which capacitor C1 130 is replaced by a short-circuit.

Although the described embodiments have made reference to amplifier circuits, the invention may also be applied to other audio signal processing circuits, such as preamplifier circuits or filter circuits. No doubt many other effective alternatives will occur to the skilled person and it will be understood that the invention is not limited to the described embodiments and encompasses modifications apparent to those skilled in the art lying within the spirit and scope of the claims appended hereto.

We claim:

1. An audio signal processing circuit with two modes, a first mode in which the circuit operates to provide an audio signal output and a second mode in which said audio signal output is suppressed, the circuit comprising at least one active signal processing stage having an output node, the output node having a dc signal path to a first dc voltage, said dc signal path including at least one first resistive element, the circuit further comprising an output signal transient suppresser, said transient suppresser comprising a second resistive element switchably connected between a second dc voltage and said output node, said second resistive element having a resistance selected such that when said second resistive element is connected the voltage on said output node in said second mode is substantially equal to a quiescent voltage on said output node in said first mode.

2. An audio signal processing circuit as claimed in claim 1 wherein said circuit is configured to connect said second resistive element between said second dc voltage and said output node during said second mode and to substantially disconnect said second resistive element during said first mode.

3. An audio signal processing circuit as claimed in claim 1 wherein said first and second resistive elements comprise resistive elements fabricated on a common substrate.

4. An audio signal processing circuit as claimed in claim 3 wherein said first resistive element comprises a plurality of resistors.

5. An audio signal processing circuit as claimed in claim 4 wherein said resistors determine an operational parameter of said audio signal processing circuit.

6. An audio signal processing circuit as claimed in claim 1 wherein said audio signal processing circuit comprises an amplifying circuit.

7. An audio signal processing circuit as claimed in claim 1 wherein said first and second voltages comprise first and second power supply voltages for said audio signal processing circuit.

8. An audio signal processing circuit as claimed in claim 1 wherein said active signal processing stage includes a device to drive said output node, and wherein said circuit is configured to effectively disconnect said drive device from said output node in said second mode.

9. An audio signal processing circuit as claimed in claim 1 wherein said output node is connected to an output coupling capacitor to provide an ac coupled circuit output.

10. An audio signal processing circuit as claimed in claim 1 further comprising a second active signal processing stage, and wherein said output node is dc coupled to an input of said second signal processing stage.

11. An audio signal processing circuit as claimed in claim 10 wherein said second signal processing stage has a second output node, and a dc signal path from said input to said second output node.

12. An audio signal processing circuit as claimed in claim 11 wherein said second signal processing stage includes a second drive device to drive said second output node, and wherein said audio signal processing circuit is configured to effectively disconnect said second drive device from said second output node in said second mode.

13. An audio signal processing circuit as claimed in claim 10 wherein said second output node is connected to an output coupling capacitor to provide an ac coupled circuit output.

14. An audio signal processing circuit as,claimed in claim 1 wherein said at least one active signal processing stage has an input and a dc signal path from said input to said output node, the audio signal processing circuit further comprising a second active signal processing stage having a second output node, the second output node being coupled to said input and having a second stage dc signal path to said first dc voltage, whereby said dc signal path to said first dc voltage includes said second stage dc signal path.

15. An audio signal processing circuit as claimed in claim 14 wherein said second signal processing stage includes a second drive device to drive said second output node, and wherein said audio signal processing circuit is configured to effectively disconnect said second device from said second output node in said second mode.

16. An audio signal processing circuit as claimed in claim 10 wherein said second signal processing stage comprises an amplifier or buffer.

17. An audio signal processing circuit as claimed in claim 1 wherein said audio signal processing circuit comprises a single-supply integrated circuit amplifier.

18. A multichannel signal processor comprising a plurality of audio signal processing circuits each as claimed in claim 1, said first and second dc voltages being common to all said audio signal processing circuits.

19. A method of suppressing an audio output transient in an audio signal processing circuit having an active mode and a standby mode, the method comprising biassing an output node of the circuit in standby mode to substantially a quiescent level of the output in active mode, said biassing being accomplished by means of a resistive divider, at least one portion of the divider being formed by one or more first resistors coupled to said output node when said audio signal processing circuit is operating in said active mode.

20. A method as claimed in claim 19 wherein said biassing comprises coupling a second portion of said resistive divider to said output node and decoupling a drive signal from said output node when switching from said active mode to said standby mode and vice-versa.

21. An audio signal processing circuit as claimed in claim 20 wherein said second portion of said resistive divider comprises one or more second resistors, the method further comprising matching said one or more first resistors to said one or more second resistors.

22. A method of suppressing an audio output transient in an audio signal processing circuit having an active mode and a standby mode, the method comprising connecting one or more bias resistors between a supply voltage for said circuit and an output node of the circuit when in standby mode, whereby said output node of the circuit is biassed, in standby mode, to substantially a quiescent level of the output in active mode.

23. An audio signal processing circuit, comprising:

means for switching the circuit between an active mode and a standby mode; and means for biassing an output node of the circuit in the standby mode to substantially a quiescent level of the output in the active mode, said means for biassing comprising a resistive divider, at least one portion of the divider being formed by one or more first resistors coupled to said output node when said audio signal processing circuit is operating in said active mode.

24. An audio signal processing circuit, comprising:

means for switching the circuit between an active mode and a standby mode; and means for connecting one or more bias resistors between a supply voltage for said circuit and an output node of the circuit when in the standby mode, whereby said output node of the circuit is biassed, in the standby mode, to substantially a quiescent level of the output in the active mode.

* * * * *